(12) United States Patent
Kawawake et al.

(10) Patent No.: US 6,982,854 B2
(45) Date of Patent: Jan. 3, 2006

(54) MAGNETORESISTANCE EFFECT DEVICE AND MAGNETORESISTANCE EFFECT HEAD COMPRISING THE SAME, AND MAGNETIC RECORDING/REPRODUCING APPARATUS

(75) Inventors: Yasuhiro Kawawake, Kyoto (JP); Yasunari Sugita, Osaka (JP); Hiroshi Sakakima, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 10 days.

(21) Appl. No.: 10/312,006

(22) PCT Filed: Jun. 21, 2001

(86) PCT No.: PCT/JP01/05334

§ 371 (c)(1),
(2), (4) Date: Apr. 4, 2003

(87) PCT Pub. No.: WO01/99206

PCT Pub. Date: Dec. 27, 2001

(65) Prior Publication Data

US 2003/0161077 A1  Aug. 28, 2003

(30) Foreign Application Priority Data

Jun. 22, 2000  (JP) ............................. 2000-187973

(51) Int. Cl.
*G11B 5/39* (2006.01)

(52) U.S. Cl. ................................................. 360/324.1
(58) Field of Classification Search ............. 360/324.1, 360/324.11, 324.12, 324.2
See application file for complete search history.

(56) References Cited

U.S. PATENT DOCUMENTS

| | | | |
|---|---|---|---|
| 5,446,613 A | 8/1995 | Rottmayer | |
| 5,657,191 A | 8/1997 | Yuan | |
| 5,668,688 A | 9/1997 | Dykes et al. | |
| 5,793,279 A * | 8/1998 | Nepela | 338/32 R |
| 6,219,205 B1 * | 4/2001 | Yuan et al. | 360/319 |
| 6,249,407 B1 | 6/2001 | Aoshima et al. | |
| 6,275,033 B1 * | 8/2001 | Kools | 324/252 |
| 6,383,574 B1 * | 5/2002 | Han et al. | 427/526 |
| 2002/0006019 A1 * | 1/2002 | Noma et al. | 360/322 |

FOREIGN PATENT DOCUMENTS

| | | |
|---|---|---|
| JP | 7-262520 | 10/1995 |
| JP | 9-128714 | 5/1997 |
| JP | 9-288807 | 11/1997 |
| JP | 2000-124522 | 4/2000 |
| JP | 2000-228002 | 8/2000 |
| JP | 2000-228004 | 8/2000 |

OTHER PUBLICATIONS

Dieny, B., et al., "Spin-valve effect in soft ferromagnetic sandwiches", Journal of Magnetism and Magnetic Materials 93, 1991, pp 101-104.

(Continued)

*Primary Examiner*—Angel Castro
(74) *Attorney, Agent, or Firm*—Hamre, Schumann, Mueller & Larson, P.C.

(57) ABSTRACT

In the present invention, a thin film whose main component is a metal having a specific resistance of 4 $\mu\Omega$·cm to 200 $\mu\Omega$·cm is used as a nonmagnetic layer of a so-called CPP-GMR element. Therefore, even when an area of the element becomes limited, the element is not increased excessively in resistance. Thus, even when a magnetic gap is narrow, a large output can be obtained.

11 Claims, 7 Drawing Sheets

OTHER PUBLICATIONS

Bass J., et al., "Current-perpendicular (CPP) magnetoresistance in magnetic metallic multilayers", Journal of Magnetism and Magnetic Materials 200, 1999, pp 274-289.

Gu, J. Y., et al., "Enhancing current-perpendicular magnetoresistance", Journal of Applies Physics, 87-9, pp 4831-4833, provided with comments made by Matsushita Electric Industrial Co., Ltd.

* cited by examiner

MAGNETORESISTANCE EFFECT DEVICE AND MAGNETORESISTANCE EFFECT HEAD COMPRISING THE SAME, AND MAGNETIC RECORDING/REPRODUCING APPARATUS

This application is a 371 of PCT/JP01/05334 filed Jun. 21, 2001.

TECHNICAL FIELD

The present invention relates to a magnetoresistive element, a magnetoresistive head and a magnetic recording and reproducing device such as a hard disk device using the magnetoresistive element.

BACKGROUND ART

In recent years, hard disk drives have had considerably increased magnetic recording density. In such a trend, significant advances also have been made in reproduction magnetic head technology. Particularly, the use of a spin valve type magnetoresistive element (MR element) utilizing a giant magnetoresistive effect (GMR) allows the sensitivity of a magnetoresistive head (MR head) to be improved substantially.

The spin valve type MR element includes two ferromagnetic layers and a nonmagnetic layer interposed between the two magnetic layers. The magnetization direction of one of the ferromagnetic layers (pinned layer) is fixed by an exchange bias magnetic field generated from a magnetization rotation suppressing layer (pinning layer; this ferromagnetic layer and the magnetization rotation suppressing layer are referred to collectively as an exchange coupling film). The magnetization direction of the other ferromagnetic layer (free layer) changes according to an external magnetic field. As a result, a relative angle formed by the respective magnetization directions of the pinned layer and the free layer changes, and this change in relative angle is detected as a change in electric resistance.

The spin valve type MR element has, for example, a known configuration in which a Ni—Fe film, a Cu film and a Fe—Mn film are used as a magnetic layer, the nonmagnetic layer and the magnetization rotation suppressing layer, respectively. When these materials are used, a magnetoresistance change ratio (MR ratio) of about 2% is obtained (Journal of Magnetism and Magnetic Materials 93, p. 101, 1991). Since the use of FeMn as a material for the magnetization rotation suppressing layer results in a small MR ratio, and the corrosion resistance provided by FeMn itself is not sufficiently high, PtMn- and NiMn-based materials have been used for reproduction magnetic heads for hard disks. Further, it has been reported that an element in which an oxide such as NiO, $\alpha$-$Fe_2O_3$ or the like is used for a magnetization rotation suppressing layer provides an MR ratio of 15% or higher.

Considering that further increases in magnetic recording density will be achieved, it is expected that existing GMR elements will reach their limits and result in shortage of output. With this in view, vigorous studies have been made on TMR (Tunnel Magnetoresistance) elements. Compared with the GMR elements, the TMR elements provide larger amounts of change in resistance, and the resistance itself of the TMR elements is considerably higher. In a TMR element, an insulation film of $Al_2O_3$ or the like is used as a nonmagnetic layer, and sensing is performed using a tunnel current passed in a direction perpendicular to a film plane.

However, the TMR elements have presented the following problem. That is, when an area of an element becomes extremely limited as magnetic recording density is increased, the resistance of the element becomes too high.

DISCLOSURE OF THE INVENTION

With the foregoing in mind, it is proposed by the present invention that a so-called CPP-GMR (Current Perpendicular to the Plane) element is used for adaptation to further the achievement of super high-density magnetic recording. In the CPP-GMR element, current is passed in a direction perpendicular to a film plane while in a conventional GMR element, current is passed in a film plane (CIP, Current in Plane).

That is, a magnetoresistive element according to the present invention includes a first magnetic layer (free layer), a nonmagnetic layer, a second magnetic layer (pinned layer) laminated to the first magnetic layer through the nonmagnetic layer, and a magnetization rotation suppressing layer for suppressing magnetization rotation of the second magnetic layer. In the magnetoresistive element, the magnetization of the first magnetic layer is rotated more easily by an external magnetic field than the magnetization of the second magnetic layer, and a current used for sensing is passed in a direction perpendicular to a film plane. The nonmagnetic layer is formed of a thin film whose main component is a metal having a specific resistance of 4 $\mu\Omega$·cm to 200 $\mu\Omega$·cm.

According to the MR element of the present invention, even when an area of the element becomes limited, the element is not excessively increased in resistance. Thus, even when a magnetic gap is narrow, a large output can be obtained.

In this description, "main component" refers to a component contained in an amount of not less than 80 atom %. Preferably, the metal having a specific resistance falling in the above range constitutes not less than 95 atom % of the nonmagnetic layer.

The present invention also provides an MR head including the above-mentioned MR element and a magnetic shield. The magnetic shield is provided for shielding the external magnetic filed that flows from other than a magnetic recording medium to the MR element. Furthermore, the present invention also provides a magnetic recording and reproducing device that includes the above-mentioned MR head and a magnetic recording medium used for performing information recording or reproduction using the MR head.

EMBODIMENTS OF THE INVENTION

Figure 1:
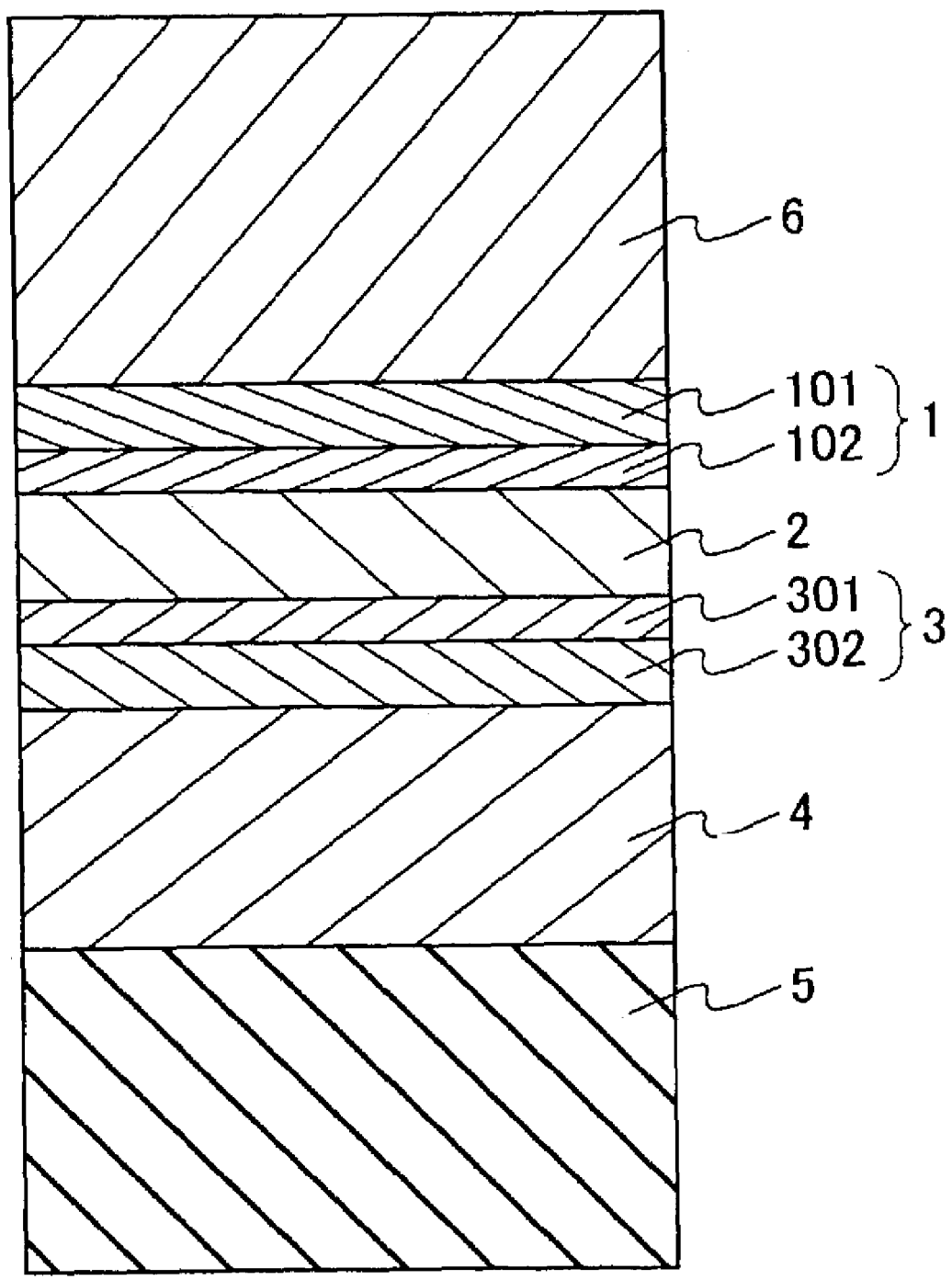
FIG. 1 is a cross sectional view of a magnetoresistive element according to an embodiment of the present invention.

As shown in FIG. 1, an MR element according to an embodiment of the present invention has a multi-layered film in which a lower electrode 5, a magnetization rotation suppressing layer 4, a pinned layer 3, a nonmagnetic layer 2, a free layer 1, and an upper electrode 6 are laminated in order. In this element, the magnetization of the pinned layer 3 is pinned down by an exchange bias magnetic field generated from the magnetization rotation suppressing layer 4. The free layer 1 as the other ferromagnetic body is separated magnetically from the pinned layer 3 by the nonmagnetic layer 2. Accordingly, the magnetization of the free layer is rotated more easily by a magnetic field from the outside than the magnetization of the pinned layer.

Generally, when the magnetization directions of two magnetic layers are anti-parallel to each other, electrons are scattered at an interface between the magnetic layer and a nonmagnetic layer, and thus an element has increased resistance. In contrast to this, when the magnetization directions are parallel to each other, electrons are hardly scattered at the interface, and thus the element has decreased resistance. Thus, an angle formed by the magnetization directions of the pinned layer 3 and the free layer 1 relatively changes according to the external magnetic field, and the electric resistance of the element in a direction perpendicular to a film plane changes according to the relative change in the angle. This change in the electric resistance can be read as a change in electric signal when current is passed between the electrodes 5 and 6. As described above, in a CPP-GMR element, a current used for sensing is passed in a direction perpendicular to a film plane.

Conventionally, consideration has been given to the use of a material such as Cu, Ag or the like for a nonmagnetic layer in a CPP-GMR element. However, metallic materials such as Cu, Ag and the like that have been used conventionally have a specific resistance of 2 $\mu\Omega$·cm or lower, which is too low as the resistance value of a material for the nonmagnetic layer of the element in which current is passed perpendicularly. Preferably, a material for the nonmagnetic layer of the element in which current is passed in a direction perpendicular to a film plane has a specific resistance of 4 $\mu\Omega$·cm or higher.

Meanwhile, preferably, the material for the nonmagnetic layer has a specific resistance reduced to some extent so that the element can provide a high MR ratio. The specific resistance of the material is preferably 200 $\mu\Omega$·cm or lower and more preferably 100 $\mu\Omega$·cm or lower. The specific resistances values of Co and Fe that are included in the magnetic layers are on the order of 5.6 $\mu\Omega$·cm and 10.7 $\mu\Omega$·cm, respectively. A material having a specific resistance up to about twice as high as these values, namely 20 $\mu\Omega$·cm or lower is used most suitably as the material for the nonmagnetic layer.

As is apparent from the above-mentioned values, in this description, the specific resistance of a metal used for a nonmagnetic layer is based on a bulk state. Generally, a metal film that is made thin so as to be used in a magnetoresistive element has a specific resistance twice to several times as high as that of a bulk form of the same metallic material. This specific resistance value depends on conditions such as a film thickness and the like. Hence, each specific resistance value described herein is based on a bulk state so that an appropriate metallic material can be specified clearly.

The film thickness of the nonmagnetic layer 2 falls within such a range that an exchange interaction between the free layer 1 and the pinned layer 3 through the nonmagnetic layer is preferably weakened, and most preferably decreased to substantially zero. Accordingly, the film thickness of the nonmagnetic layer is preferably not less than 1.2 nm and most preferably not less than 2 nm. When a spin diffusion length of electrons is taken into consideration, the film thickness of the nonmagnetic layer is preferably not more than 20 nm and most preferably not more than 10 nm so as not to lower the MR ratio.

As the film thickness of the nonmagnetic layer is increased, an exchange interaction between the magnetic layers may be attenuated while oscillating between ferromagnetism (the magnetization directions become parallel to each other) and antiferromagnetism (the magnetization directions become anti-parallel to each other). As typically shown in FIG. 3, as a film thickness (T) of the nonmagnetic layer is increased, magnetic coupling force (H coupling) between the magnetic layers that is generated by the exchange interaction is attenuated gradually while oscillating between ferromagnetic coupling and antiferromagnetic coupling. In this case, even when the film thickness of the nonmagnetic layer falls within, for example, the above range (1.2 to 20 nm), the exchange interaction between the magnetic layers may become too strong. Thus, the film thickness of the nonmagnetic layer should be determined by a point at which an oscillating coupling curve crosses a horizontal axis (H coupling=0) of FIG. 3 or a point in the vicinity thereof, rather than simply being determined so as to fall within the above-mentioned range.

Figure 3:
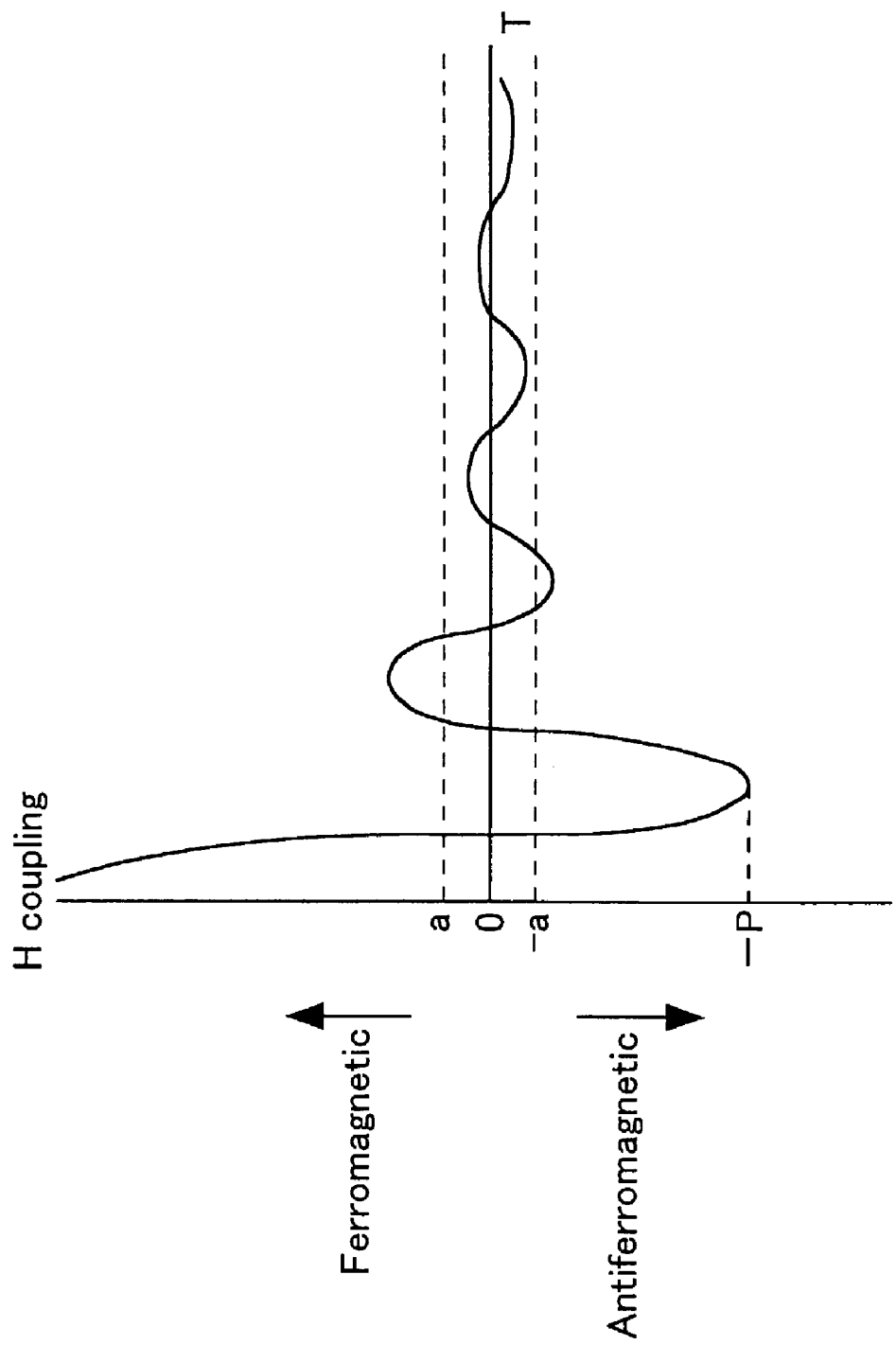
FIG. 3 is a graph showing an example of how an exchange interaction between magnetic layers is changed with increasing film thickness of a nonmagnetic layer.

Specifically, the film thickness of the nonmagnetic layer is determined so that the magnetic coupling force (H coupling) between the free layer and the pinned layer has an absolute value preferably not more than 20% (|H coupling|$\leq$0.2×|−p|) and more preferably not more than 10% of that of the magnetic coupling force in the most antiferromagnetic state. As shown in FIG. 3, this film thickness is determined so that a magnetic coupling force falls within a range between "−a" and "a", where "a" indicates 20% of an absolute value of the maximum antiferromagnetic coupling force (0.2×|−p|=a). For the sake of convenience, in FIG. 3, ferromagnetism is indicated as a positive magnetic coupling force, and antiferromagnetism is indicated as a negative magnetic coupling force.

As for an artificial lattice film in practical use, consideration also should be given to ferromagnetic coupling (orange peel coupling) caused by roughness in addition to the indirect exchange interaction. Thus, more preferably, the indirect exchange interaction is zero or is antiferromagnetic within a range satisfying the above-mentioned condition.

Preferably, the nonmagnetic layer has an area of not more than 0.01 $\mu m^2$. The area of the nonmagnetic layer is defined as an area through which a current used for sensing (sense current) is passed. In a TMR element, when a film area is limited to this extent, the resistance value becomes too high. The area of the nonmagnetic layer is more preferably not more than 0.008 $\mu m^2$ and most preferably not more than 0.005 $\mu m^2$. Although a lower limit of the area is not particularly limited thereto, preferably, the area of the nonmagnetic layer is not less than 0.0001 $\mu m^2$.

A metal constituting a main component of the nonmagnetic layer may be in the form of a single metal or an alloy. The nonmagnetic layer may contain at least one selected from the group consisting of Be, Bi, Cr, Hf, In, Ir, Mg, Mn, Mo, Nb, Os, Pd, Pt, Re, Ru, Rh, Sb, Se, Ta, Th, Ti, Tl, V, W, Y and Zr. Further, an alloy of metals selected from the above-mentioned group or an alloy of metals of a metal selected from the above-mentioned group and a metal other than the metals in the group may be used.

Most preferably, Cr is used as a metallic material for the nonmagnetic layer. The specific resistance of Cr is as high as 12.8 $\mu\Omega\cdot cm$, and a Fe/Cr multi-layer film provides a substantial amount of change in magnetic resistance. Thus, when the nonmagnetic layer contains Cr as a main component, preferably, the magnetic layer contains Fe. When using the nonmagnetic layer containing Cr as a main component, more preferably, at least one selected from the free layer and the pinned layer is composed of one or more magnetic films, and at least the magnetic film adjacent to the nonmagnetic layer contains Fe as a main component.

In the element shown in FIG. 1, the magnetic layers of a two-layered structure are used. When a multi-layered magnetic layer is used, a preferred combination with a material for a nonmagnetic layer can be realized while other properties such as soft magnetization of the magnetic layer also can be taken into consideration.

When the nonmagnetic layer 2 contains Cr as a main component, in the free layer 1, a Fe film should be used as an interface magnetic layer 102, and a film of a softer magnetic material than Fe such as a Ni—Fe film and a Ni—Fe—Co film should be used as a magnetic layer 101. Further, also in the pinned layer 3, a Fe film may be used as an interface magnetic layer 301, and a magnetic film of Co, Co—Fe, Ni—Fe, Ni—Fe—Co or the like may be used as a magnetic layer 302 so that a magnetization rotation suppressing effect exerted by the magnetization rotation suppressing layer 4 can be reinforced.

Other preferred examples of the metallic material for the nonmagnetic layer include Ir, Ru and Rh. When the nonmagnetic layer contains at least one selected from Ir, Ru and Rh as a main component, preferably, the magnetic layer contains Fe, Co and Ni or an alloy of these metals. When using the nonmagnetic layer containing at least one selected from Ir, Ru and Rh as a main component, more preferably, at least one selected from the free layer and the pinned layer is composed of one or more magnetic films, and at least the magnetic film adjacent to the nonmagnetic layer contains at least one selected from Fe, Co and Ni as a main component.

The pinned layer 3 may be formed of a so-called synthetic ferrimagnetic pinned layer in which a pair of ferromagnetic layers are coupled antiferromagnetically through a nonmagnetic layer. This configuration allows an effect of pinning down the magnetization of the pinned layer to be enhanced. Further, part of the magnetization of the pinned layer is cancelled, so that a magnetic flux leaking from the pinned layer to the free layer is reduced, thereby allowing a leakage magnetic field to be adjusted. In this case, each of the ferromagnetic layers suitably has a thickness of 1 to 3 nm. The nonmagnetic layer to be interposed between the ferromagnetic layers is made suitably of a material such as Ru, Ir or the like. The film thickness of the nonmagnetic layer should be 0.3 to 1.2 nm.

The magnetization rotation suppressing layer 4 can be made of a material such as PtMn, NiMn, PdPtMn, CrMn, FeMn or the like. There is no limit to a material for the electrodes 5 and 6, and a material such as Cu or the like that has been used conventionally can be used.

Although not shown in FIG. 1, a substrate on which the respective thin films described above are formed should be formed of a substrate of glass, MgO, Si, $Al_2O_3$—TiC or the like with a smooth surface. For the fabrication of an MR head, an $Al_2O_3$—TiC substrate is used suitably.

As required by an application, a magnetic shield or the like further may be formed between the substrate and the above-mentioned thin films. Further, a base layer may be interposed between the substrate and the magnetization rotation suppressing layer for the purposes of improving a property of the magnetization rotation suppressing layer and the like. As the base layer, a Ta film, a NiFe film, a NiFeCr alloy film, a laminate of these films or the like can be used. The thickness of the base layer is suitably on the order of 1 to 10 nm.

The multi-layered film shown in FIG. 1 may be formed by laminating the respective films in a reverse order starting from an upper side of the figure (from a side of the free layer 1) instead of laminating in an order starting from a lower side of the figure. Although not particularly limited thereto, sputtering is used suitably as a method of forming the respective layers. The sputtering may be any one of DC sputtering, RF sputtering, iron beam sputtering and the like.

Figure 2:
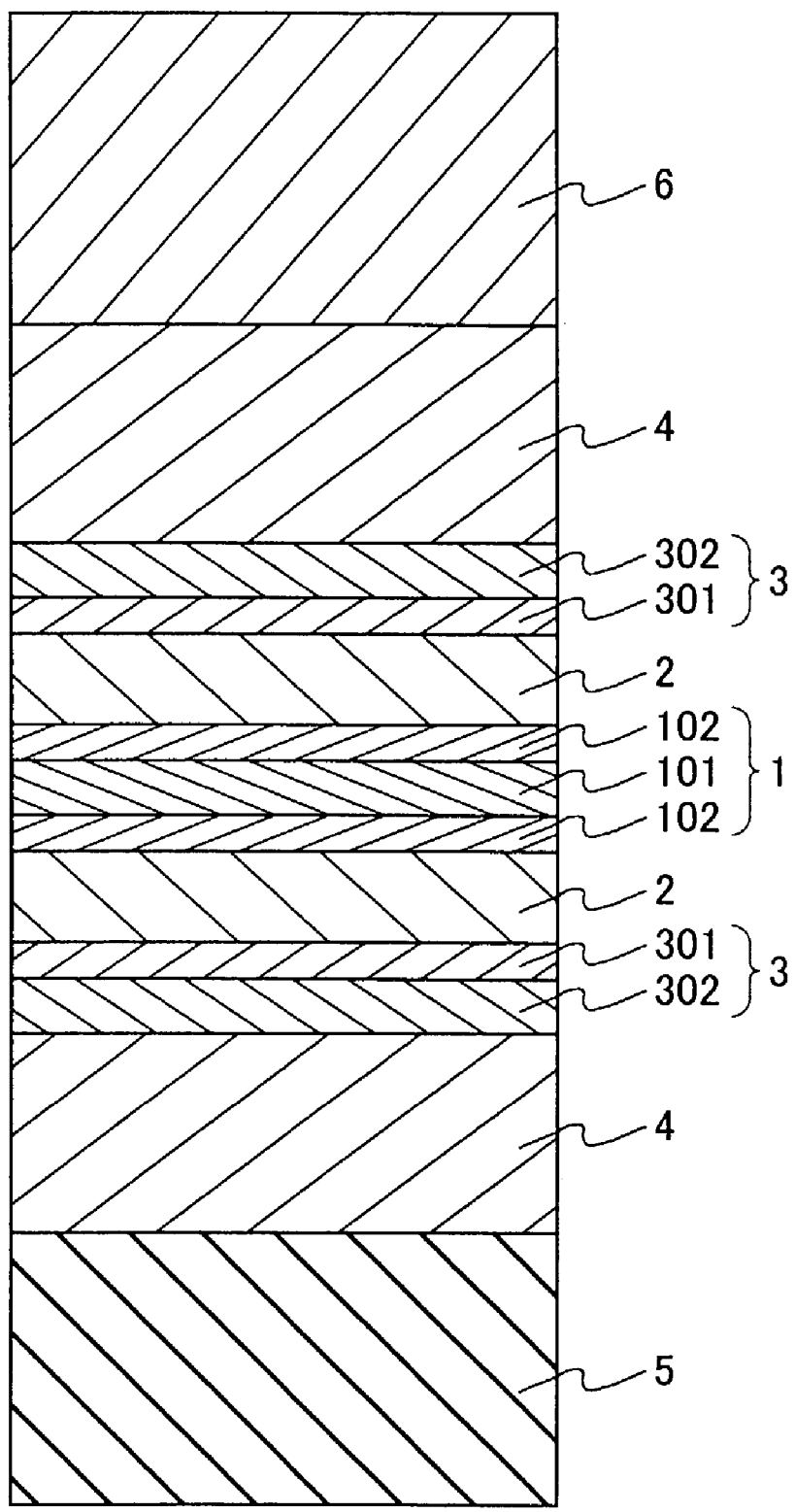
FIG. 2 is a cross sectional view of a magnetoresistive element according to another embodiment of the present invention.

The present invention is also applicable to an element having a configuration using pinned layers and a free layer interposed between the pinned layers. As shown in FIG. 2, this element can be formed by, for example, laminating a lower electrode 5, a magnetization rotation suppressing layer 4, a pinned layer 3, a nonmagnetic layer 2, a free layer 1, a nonmagnetic layer 2, a pinned layer 3, a magnetization rotation suppressing layer 4, and an upper electrode 6 in this order. Similarly, in this case, an interface magnetic layer 102 (301) may be provided in the free layer 1 (pinned layer 3) adjacent to the nonmagnetic layer 2.

Figure 4:
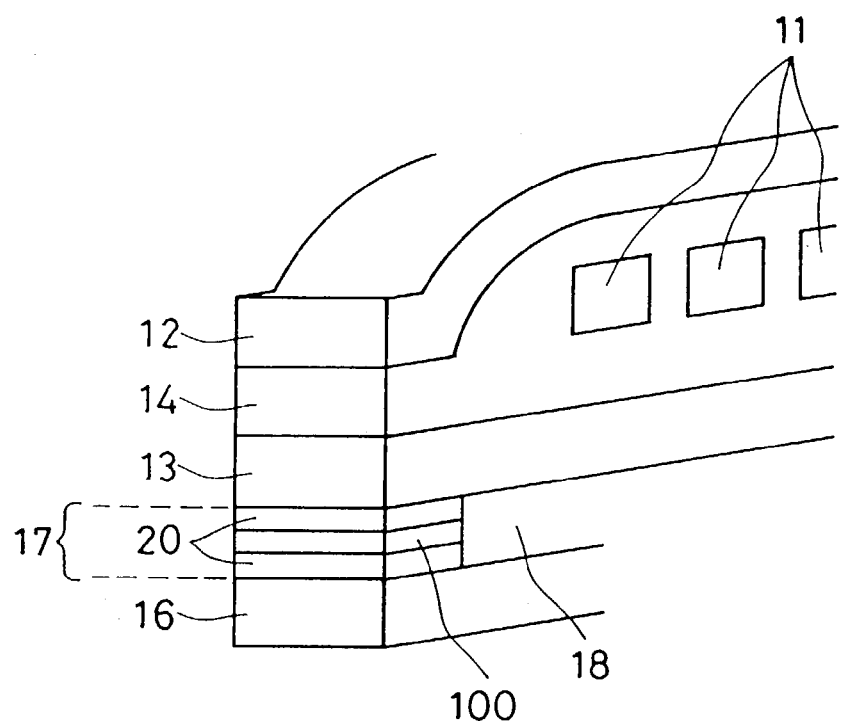
FIG. 4 is a perspective view of a magnetoresistive head according to an embodiment of the present invention.

FIG. 4 shows an example of an MR head using the above-described magnetoresistive element according to the present invention.

An MR element 100 is interposed between an upper magnetic shield (common shield) 13 and a lower magnetic shield 16. These magnetic shields are provided so that an external magnetic field from other than a medium exerts no influence on the element. As a material for the shields, a soft magnetic film of an alloy of Ni—Fe, Fe—Al—Si, Co—Nb—Zr or the like is used suitably. In this head, the magnetic shields 13 and 16 also function as electrodes for feeding current to the element. In a portion between both the electrodes other than an MR element portion, an insulation film 18 is provided. As shown in the figure, conductive spacers 20 may be interposed between the MR element and the shields. In this head, the MR element 100 and the conductive spacers 20 constitute a reproduction gap 17.

A nonmagnetic layer 14 and an upper core 12 further are laminated in order on the common shield 13. These members together with coils 11 constitute a recording head.

Figure 5:
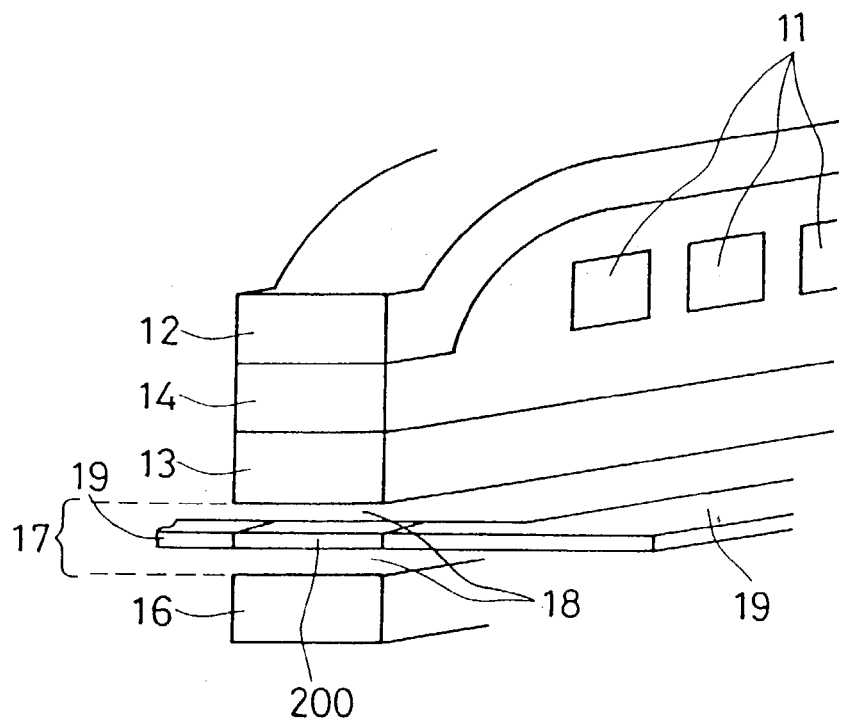
FIG. 5 is a perspective view of a magnetoresistive head using a conventional MR element.

As shown in FIG. 5, in a magnetic head using a CIP-GMR element, insulation films 18 are interposed as shield gap materials between an MR element 200 and magnetic shields 13 and 16. In this MR element, a sense current flowing between electrodes 19 flows in a film plane direction, and thus it is required that the element be insulated electrically from the shield members using the insulation films 18.

In the MR head shown in FIG. 4, the conductive spacer 20 is not an indispensable member. Therefore, when the reproduction gap 17 is required to be narrowed, the spacer can be made thinner or removed. On the other hand, in the MR head shown in FIG. 5, it is required that the insulation film 18 have a thickness not less than a given thickness so that electrical insulation can be secured. Accordingly, there is a limit to the degree to which a reproduction gap 17 can be narrowed. Thus, the MR head according to the present invention has the advantage that a magnetic gap can be narrowed further.

Figure 6:
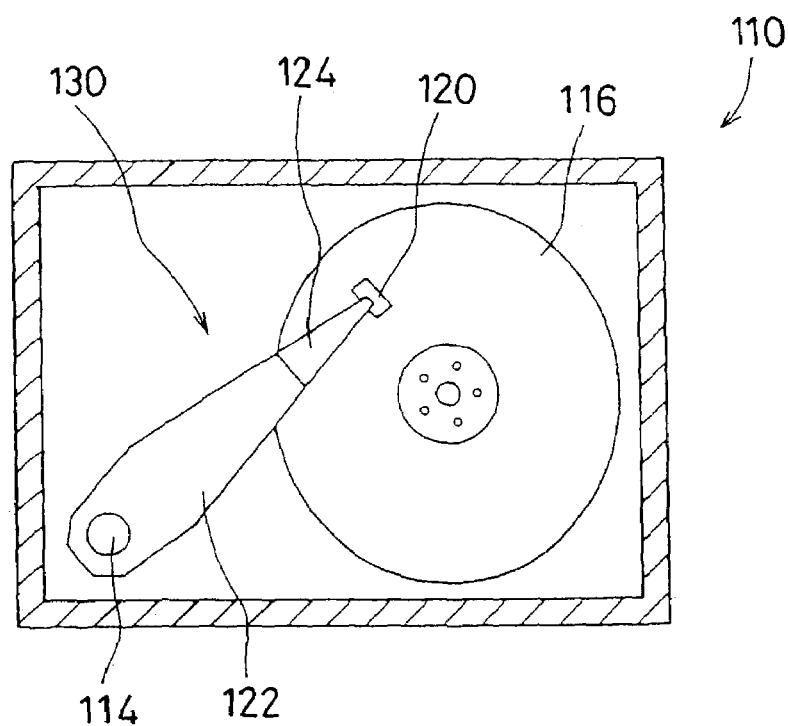
FIG. 6 is a plan view of a magnetic information recording and reproducing device according an embodiment of the present invention.
Figure 7:
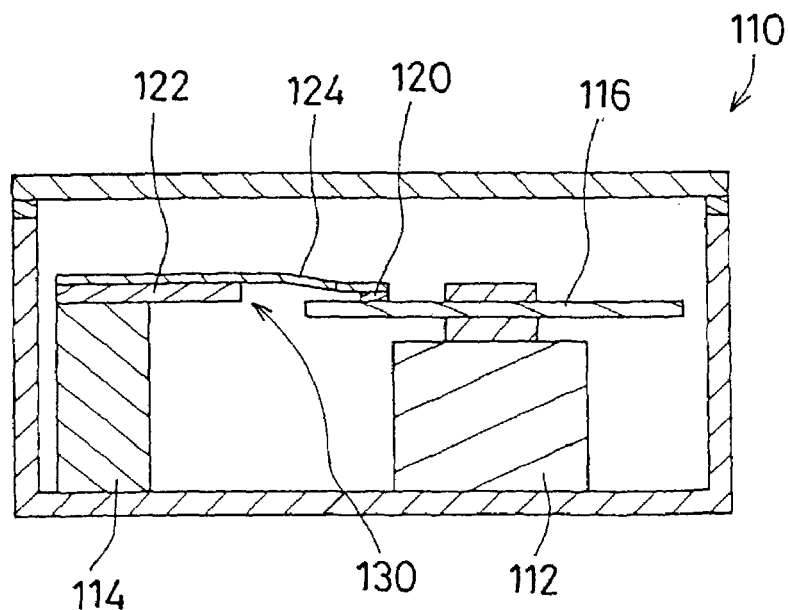
FIG. 7 is a cross sectional view of a magnetic information recording and reproducing device according to an embodiment of the present invention.

As shown in FIGS. 6 and 7, a hard disk device 110 using this MR head includes a slider 120 for supporting the MR head, a head supporting device 130 for supporting the slider, an actuator 114 for allowing the MR head to perform a tracking operation through the head supporting device, and a disk-driving motor 112 for driving a disk 116 to rotate. The head supporting device 130 includes an arm 122 and a suspension 124.

The disk-driving motor 112 drives the disk 116 to rotate at a predetermined speed. The actuator 114 allows the slider 120 supporting the MR head to move in a radial direction of the disk 116 so that the MR head can be given access to a predetermined data track on the disk 116. The actuator 114 is formed of, for example, a linear or rotary type voice coil motor.

The slider 120 for supporting the MR head is formed of, for example, an air-bearing slider. In this case, the slider 120 is brought into contact with a surface of the disk 116 in starting and stopping operations of the hard disk device 110. In recording and reproducing operations of the hard disk device 110, the slider 120 is maintained over the surface of the disk 116 by an air bearing formed between the disk 116 being rotated and the slider 120. The MR head supported by the slider 120 performs information recording and reproduction with respect to the disk 116.

EXAMPLE (Example 1)

Figure 8:
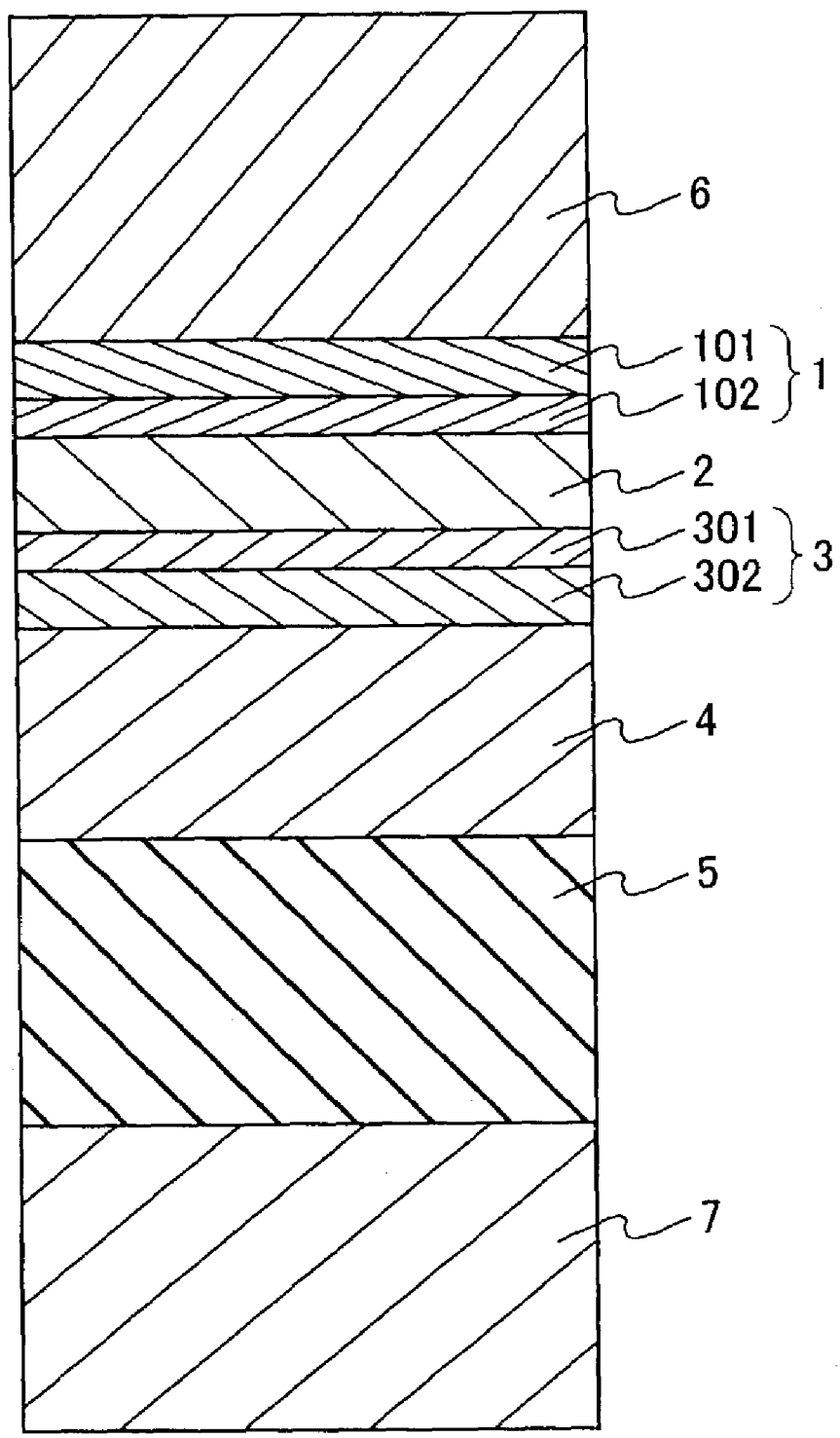
FIG. 8 is a cross sectional view of an element fabricated in Example 1.

A magnetoresistive element having a configuration shown in FIG. 8 was fabricated by using a multi-sputtering device. As a material for a substrate 7, Si was used. A Cu film, a Pt—Mn film and a Co—Fe film were formed as a lower electrode 5 (used also as a base layer), a magnetization rotation suppressing layer 4, and a pinned magnetic layer 302, respectively. Further, Fe films were formed as interface magnetic layers 301 and 102. Furthermore, a Cr film, a Ni—Fe film and a Cu film were formed as a nonmagnetic layer 2, a soft magnetic layer 101 and an upper electrode 6, respectively. By using a vacuum chamber exhausted to a pressure of not more than $1 \times 10^{-8}$ Torr, sputtering was performed while feeding an Ar gas so that a pressure of about 0.8 m Torr was attained.

The film configuration of the element thus fabricated is shown below along with the thicknesses of the respective films (hereinafter, film thicknesses are expressed in nm).

Element A: Substrate/Cu (500)/$Pt_{0.5}Mn_{0.5}$ (30)/$Co_{0.9}Fe_{0.1}$ (2)/Fe (2)/Cr (2)/Fe (1)/NiFe (10)/Cu It has been known that as shown in FIG. 3, magnetic coupling generated by an exchange interaction in the case of using a Cr film as a material for a nonmagnetic layer is attenuated while oscillating between ferromagnetic coupling and antiferromagnetic coupling. When the Cr film has a thickness of 2 nm, the magnetic coupling becomes approximately zero.

For comparison, an element in which Cu was used as a material for a nonmagnetic layer was fabricated by the same method as that used in the above-mentioned case. However, in this case, since the MR ratio was substantially lowered by the insertion of Fe interface layers, instead of inserting the interface magnetic layers, a pinned layer and a free layer each having an increased thickness were used. The film configuration of this element is shown below.

Element B: Substrate/Cu (500)/$Pt_{0.5}Mn_{0.5}$ (30)/$Co_{0.9}Fe_{0.1}$ (3)/Cu (2)/NiFe (11)/Cu Each of the MR elements thus obtained was taken out of a film-forming device and subjected to a heat treatment in which the MR element was kept for 5 hours at a temperature of 250° C. under a magnetic field of 5 kOe in a vacuum of $1 \times 10^{-5}$ Torr or less. Then, with respect to each of the elements, patterning was performed using an electron-beam exposure machine so that an element portion of $0.1 \times 0.1$ $\mu m^2$ was obtained. Further, each element was processed so that electrodes could be taken out. After that, MR properties of the elements were evaluated by a DC four-terminal method. In the evaluation, a magnetic field of up to 400 kA/m at room temperature was applied and a current of the same magnitude was fed to each of the elements. The results of the evaluation are shown in the following table. The amount of change in resistance is expressed as a value relative to that of Sample B.

TABLE 1

| Element | MR ratio (%) | Change in Resistance |
|---------|--------------|----------------------|
| A       | 55           | 10                   |
| B       | 48           | 1                    |

Compared with Element B that is a conventional MR element, Element A exhibits no substantial difference in the MR ratio while having a large difference in the amount of change in resistance that is a factor directly affecting the output.

Next, each of the Elements A and B was used to constitute the MR head shown in FIG. 4, and properties of the MR heads thus obtained were evaluated. A $Al_2O_3$—TiC substrate was used as a substrate, and a $Ni_{0.8}Fe_{0.2}$ alloy and $Al_2O_3$ were used as materials for magnetic shields and an insulation film, respectively.

With respect to each of these heads, an evaluation of the output was performed by applying an alternating signal magnetic field of about 3 kA/m while feeding a direct current as a sense current between electrodes (magnetic shields). The results of the evaluations are shown in the following table. The output shown in the table also is expressed as a value relative to that of the MR head using the Element B.

TABLE 2

| Element | Relative Output |
|---------|-----------------|
| A       | +6              |
| B       | 0               |

The MR head using the Element A provided a larger output than that of the MR head using the conventional Element B.

(Example 2)

Figure 9:
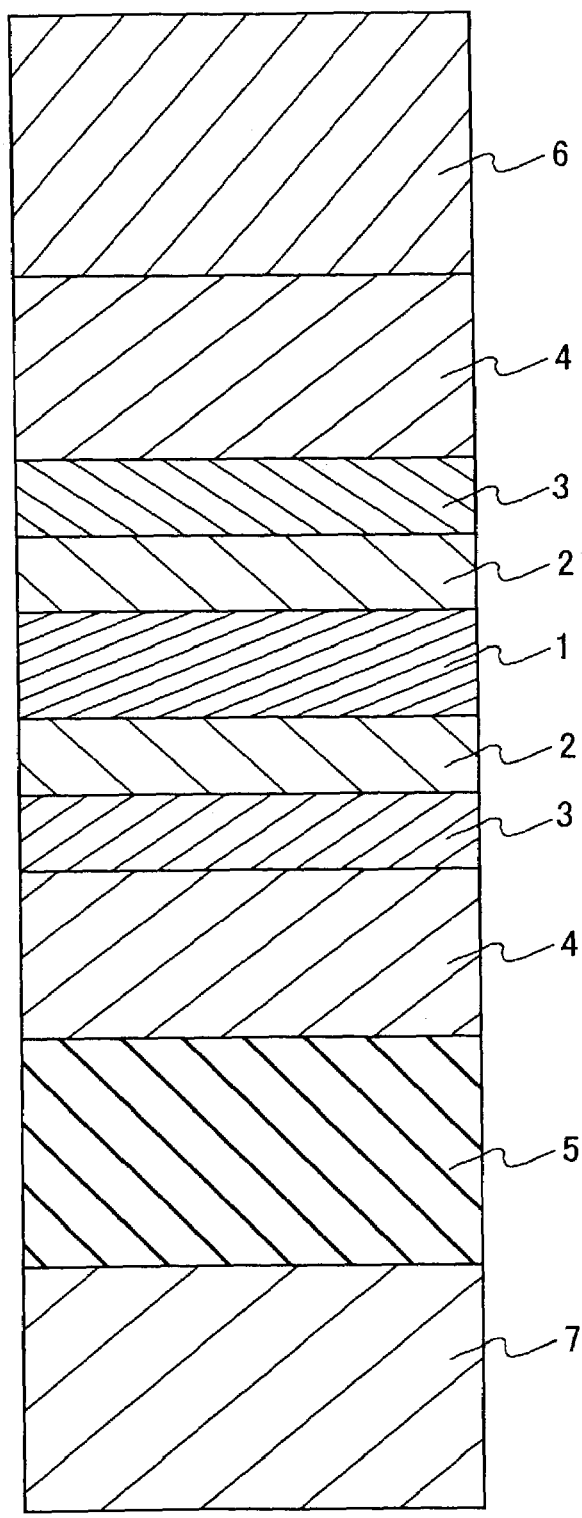
FIG. 9 is a cross sectional view of an element fabricated in Example 2.

In the same manner as in Example 1, an MR element having a structure shown in FIG. 9 was fabricated. However, in this case, although shown to be a single layer, a pinned layer 3 was formed of a synthetic ferrimagnetic pinned layer of CoFe/Ru/CoFe. A glass substrate was used as a substrate 7, and Cu films were used as a lower electrode 5 and an upper electrode 6. Further, a Ni—Mn alloy film, a Ru film, a $Co_{0.9}Fe_{0.1}$ alloy film were used as a magnetization rotation suppressing layer 4, a nonmagnetic layer 2, and a free layer 1, respectively. No interface magnetic layer was formed in this case. The film configuration of this element is shown below.

Element C: Substrate/Cu (500)/Ta (3)/$Ni_{0.5}Mn_{0.5}$ (30)/$Co_{0.9}Fe_{0.1}$ (2)/Ru (0.7)/$Co_{0.9}Fe_{0.1}$ (3)/Ru (2.5)/$Co_{0.9}Fe_{0.1}$ (2)/Ru (2.5)/$Co_{0.9}Fe_{0.1}$ (3)/Ru (0.7)/$Co_{0.9}Fe_{0.1}$ (2)/$Ni_{0.5}Mn_{0.5}$ (30)/Cu In this configuration, a Ta film functions as a base film for improving a property of the magnetization rotation suppressing layer. In the same manner, the following configurations also were obtained by forming nonmagnetic films of Ir and Rh, respectively.

Element D: Substrate/Cu (500)/Ta (3)/$Ni_{0.5}Mn_{0.5}$ (30)/$Co_{0.9}Fe_{0.1}$ (2)/Ru (0.7)/$Co_{0.9}Fe_{0.1}$ (3)/Ir (2.5)/$Co_{0.9}Fe_{0.1}$ (2)/Ir (2.5)/$Co_{0.9}Fe_{0.1}$ (3)/Ru (0.7)/$Co_{0.9}Fe_{0.1}$ (2)/$Ni_{0.5}Mn_{0.5}$ (30)/Cu Element E: Substrate/Cu (500)/Ta (3)/$Ni_{0.5}Mn_{0.5}$ (30)/$Co_{0.9}Fe_{0.1}$ (2)/Ru (40.7)/$Co_{0.9}Fe_{0.1}$ (3)/Rh (2.5)/$Co_{0.9}Fe_{0.1}$ (2)/Rh (2.5)/$Co_{0.9}Fe_{0.1}$ (3)Ru (0.7)/$Co_{0.9}Fe_{0.1}$ (2)/$Ni_{0.5}Mn_{0.5}$ (30)/Cu As in the case of using a Cr film as the nonmagnetic layer, magnetic coupling generated by an exchange interaction in the case of using a film of Ru, Rh or Ir as the nonmagnetic layer is attenuated while oscillating between ferromagnetic coupling and antiferromagnetic coupling as the thickness of the nonmagnetic layer is increased. When the thickness of the above-mentioned film of Ru or the like is 2.5 nm, as in the case of using the Cr film (Example 1), the magnetic coupling satisfies the relationship |H coupling|≦0.2×|p| because the exchange interaction is attenuated to a sufficient degree.

For comparison, in the same manner, the following configuration also was obtained by forming a nonmagnetic film of Cu.

Element F: Substrate/Cu (500)/$Ni_{0.5}Mn_{0.5}$ (30)/$Co_{0.9}Fe_{0.1}$ (2)/Ru (0.7)/$Co_{0.9}Fe_{0.1}$ (3)/Cu (2.5)/$Co_{0.9}Fe_{0.1}$ (2)/Cu (2.5)/$Co_{0.9}Fe_{0.1}$ (3)/Ru (0.7)/$Co_{0.9}Fe_{0.1}$ (2)/$Ni_{0.5}Mn_{0.5}$ (30)/Cu With respect to each of the MR elements thus fabricated, a heat treatment followed by patterning was performed, and then measurements were made of MR effects by feeding current in a direction perpendicular to a film plane by the same method as that used in Example 1. The results of the measurements are shown in Table 3. In the table, the amounts of change in resistance are expressed as values relative to that of Element F.

TABLE 3

| Element | MR ratio (%) | Change in Resistance |
|---------|--------------|----------------------|
| C | 41 | 4 |
| D | 55 | 7 |
| E | 39 | 5 |
| F | 58 | 1 |

As can be seen from Table 3, it was confirmed that each of Elements D to E could provide a larger amount of change in resistance than that of the Element F that was a conventional MR element, thereby allowing a large output to be obtained.

The MR element according to the present invention can secure a large output while allowing adaptation to a narrowed gap. Thus, a magnetoresistive head and a magnetic information recording and reproducing device using this MR element can be adapted to high-density recording.

What is claimed is:

1. A magnetoresistive element comprising:
a first magnetic layer;
a nonmagnetic layer;
a second magnetic layer laminated to the first magnetic layer through the nonmagnetic layer; and
a magnetization rotation suppressing layer for suppressing magnetization rotation of the second magnetic layer,
wherein magnetization of the first magnetic layer is rotated more easily by an external magnetic field than magnetization of the second magnetic layer;
a current used for sensing is passes in a direction perpendicular to a film plane and parallel to a stacking direction of the first magnetic layer, the non-magnetic layer and the second magnetic layer;
the nonmagnetic layer is formed of a thin film whose main component is a metal having a specific resistance of 4 $\mu\Omega\cdot cm$ to 200 $\mu\Omega\cdot cm$; and
a film thickness of the nonmagnetic layer is determined so that magnetic coupling force between the first magnetic layer and the second magnetic layer has an absolute value not more than 20% of that of the magnetic coupling force in the most antiferromagnetic state, the magnetic coupling force being attenuated while oscillating between ferromagnetic coupling and antiferromagnetic coupling as the film thickness is increased.

2. A magnetoresistive element comprising:
a first magnetic layer;
a nonmagnetic layer;
a second magnetic layer laminated to the first magnetic layer through the nonmagnetic layer; and
a magnetization rotation suppressing layer for suppressing magnetization rotation of the second magnetic layer,
wherein magnetization of the first magnetic layer is rotated more easily by an external magnetic field than magnetization of the second magnetic layer;
a current used for sensing is passes in a direction perpendicular to a film plane and parallel to a stacking direction of the first magnetic layer, the non-magnetic layer and the second magnetic layer;
the nonmagnetic layer is formed of a thin film whose main component is a metal having a specific resistance of 4 $\mu\Omega\cdot cm$ to 200 $\mu\Omega\cdot cm$; and
the nonmagnetic layer is formed of a thin film whose main component is a metal having a specific resistance of 4 $\mu\Omega\cdot cm$ to 200 $\mu\Omega\cdot cm$; and has an area of not more than 0.01 $\mu m^2$.

3. The magnetoresistive element according to claim 2, wherein the nonmagnetic layer contains at least one selected from the group consisting of Be, Bi, Cr, Hf, In, Ir, Mg, Mn, Mo, Nb, Os, Pd, Pt, Re, Ru, Rh, Sb, Se, Ta, Th, Ti, Tl, V, W, Y and Zr.

4. The magnetoresistive element according to claim 2, wherein the nonmagnetic layer has a film thickness of not less than 1.2 nm.

5. The magnetoresistive element according to claim 4, wherein the nonmagnetic layer has a film thickness of not more than 20 nm.

6. The magnetoresistive element according to claim 2, wherein the nonmagnetic layer contains Cr as a main component.

7. The magnetoresistive element according to claim 6, wherein at least one selected from the first magnetic layer and the second magnetic layer is composed of one or more magnetic films, and at least the magnetic film adjacent to the nonmagnetic layer contains Fe as a main component.

8. The magnetoresistive element according to claim 2, wherein the nonmagnetic layer contains at least one selected from Ir, Ru and Rh as a main component.

9. The magnetoresistive element according to claim 8, wherein at least one selected from the first magnetic layer and the second magnetic layer is composed of one or more magnetic films, and at least the magnetic film adjacent to the nonmagnetic layer contains at least one selected from Fe, Co and Ni as a main component.

10. A magnetoresistive head comprising a magnetoresistive element as claimed in claim 2 and a magnetic shield.

11. A magnetic recording and reproducing device comprising a magnetoresistive head as claimed in claim 10 and a magnetic recording medium used for performing information recording or reproduction using the magnetoresistive head.

* * * * *

UNITED STATES PATENT AND TRADEMARK OFFICE
CERTIFICATE OF CORRECTION

PATENT NO. : 6,982,854 B2  
APPLICATION NO. : 10/312006  
DATED : January 3, 2006  
INVENTOR(S) : Kawawake et al.

It is certified that error appears in the above-identified patent and that said Letters Patent is hereby corrected as shown below:

Col. 10, line 14: "is passes in" should read --is passed in--  
Col. 10, line 41: "is passes in" should read --is passed in--

Signed and Sealed this

Twenty-first Day of November, 2006

JON W. DUDAS  
*Director of the United States Patent and Trademark Office*